US008878706B2

United States Patent
Fujita (10) Patent No.: US 8,878,706 B2
(45) Date of Patent: Nov. 4, 2014

(54) SERIAL-PARALLEL CONVERSION CIRCUIT, METHOD FOR DRIVING THE SAME, DISPLAY DEVICE, AND SEMICONDUCTOR DEVICE

(71) Applicant: Semiconductor Energy Laboratory Co., Ltd., Kanagawa-ken (JP)

(72) Inventor: Masashi Fujita, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 99 days.

(21) Appl. No.: 13/753,937

(22) Filed: Jan. 30, 2013

(65) Prior Publication Data

US 2013/0201165 A1 Aug. 8, 2013

(30) Foreign Application Priority Data

Feb. 2, 2012 (JP) ................................ 2012-020538

(51) Int. Cl.
*H03M 9/00* (2006.01)
*H03K 17/041* (2006.01)
*G09G 5/00* (2006.01)

(52) U.S. Cl.
CPC ............ *H03M 9/00* (2013.01); *G09G 2370/08* (2013.01); *H03K 17/04106* (2013.01); *G09G 5/00* (2013.01); *G09G 5/006* (2013.01)
USPC ............................ 341/101; 345/204; 345/690

(58) Field of Classification Search
CPC ......... H03M 9/00; G09G 3/3208; G09G 5/00; G06F 3/041; G06F 9/00; G06F 9/37
USPC .................. 345/204, 690; 341/101, 136, 144
See application file for complete search history.

(56) References Cited

U.S. PATENT DOCUMENTS

| 6,121,906 | A | * | 9/2000 | Kim ............................... 341/100 |
| 6,388,652 | B1 | | 5/2002 | Yamazaki et al. |
| 6,778,164 | B2 | | 8/2004 | Yamazaki et al. |
| 6,937,173 | B2 | * | 8/2005 | Kim ............................. 341/101 |
| 6,956,324 | B2 | | 10/2005 | Yamazaki |
| 7,256,776 | B2 | | 8/2007 | Yamazaki et al. |
| 7,750,899 | B2 | | 7/2010 | Miyata et al. |
| 7,830,370 | B2 | | 11/2010 | Yamazaki et al. |
| 7,978,190 | B2 | | 7/2011 | Yamazaki et al. |
| 8,094,047 | B2 | * | 1/2012 | King ............................. 341/101 |
| 2010/0123609 | A1 | * | 5/2010 | Yu et al. ....................... 341/101 |
| 2011/0187730 | A1 | * | 8/2011 | Jun et al. ...................... 345/545 |
| 2013/0162609 | A1 | | 6/2013 | Miyake et al. |
| 2013/0207945 | A1 | * | 8/2013 | Watanabe .................... 345/204 |

FOREIGN PATENT DOCUMENTS

| JP | 2011-237644 | 11/2011 |
| JP | 2011-238067 | 11/2011 |

* cited by examiner

*Primary Examiner* — Andrew Sasinowski
(74) *Attorney, Agent, or Firm* — Husch Blackwell LLP (57) ABSTRACT

A serial-parallel conversion circuit for converting a high-speed serial signal to a parallel signal is provided. Further, a display device with high image quality and fewer external connection terminals is provided. Furthermore, a method for driving a serial-parallel conversion circuit for converting a high-speed serial signal to a parallel signal is provided. A serial-parallel conversion circuit includes a plurality of units in each of which a sampling switch and an amplifier are connected to each other. In the serial-parallel conversion circuit, each sampling switch is configured to output part of a serial signal to its respective amplifier only through one transistor.

18 Claims, 7 Drawing Sheets

SERIAL-PARALLEL CONVERSION CIRCUIT, METHOD FOR DRIVING THE SAME, DISPLAY DEVICE, AND SEMICONDUCTOR DEVICE

BACKGROUND OF THE INVENTION

1. Field of the Invention

The present invention relates to a serial-parallel conversion circuit and a display device including the serial-parallel conversion circuit. Further, the present invention relates to a method for driving the serial-parallel conversion circuit.

2. Description of the Related Art

In order to display an image on a display device, a large number of image signals need to be supplied to the display device. Further, a large number of wirings are needed to connect a device for supplying image signals (e.g., a main body of an electronic device) to the display device. For example, about 640 wirings are needed for VGA. Accordingly, the wirings occupy volume in part of the display device, which might limit the flexibility in design such as the size of the electronic device and the position of the display device.

In view of such a background, it is desired that the number of external connection terminals in a display device be reduced. For example, Patent Document 1 discloses a method in which a serial-parallel conversion circuit is provided in a display device and an image signal is supplied as a serial signal from a main body of an electronic device through a serial cable.

Further, a serial-parallel conversion circuit for converting a high-speed serial signal to a parallel signal is desired.

Figure 7A:
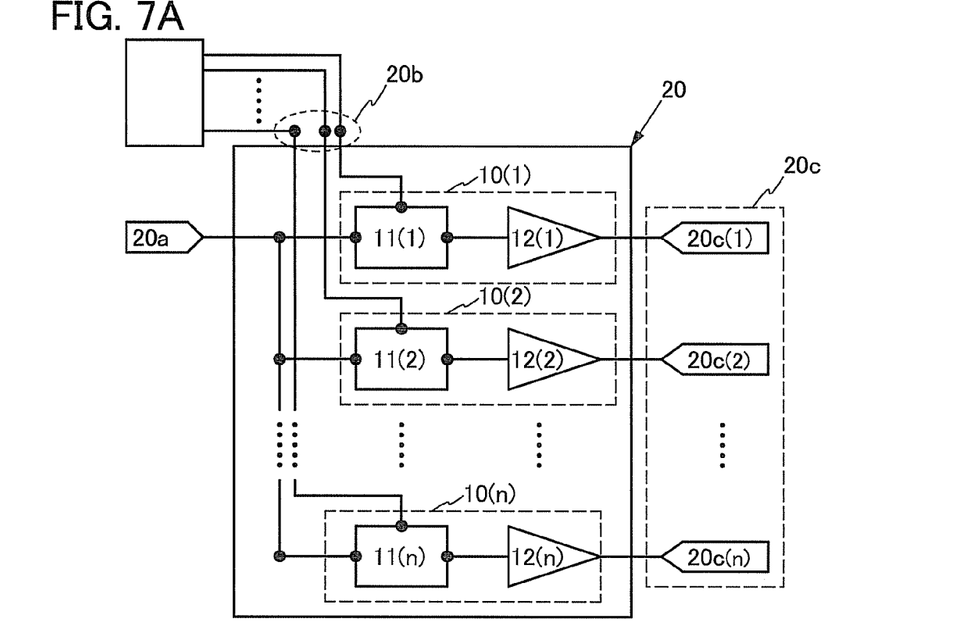
FIGS. 7A and 7B illustrate a conventional serial-parallel conversion circuit.
Figure 7B:
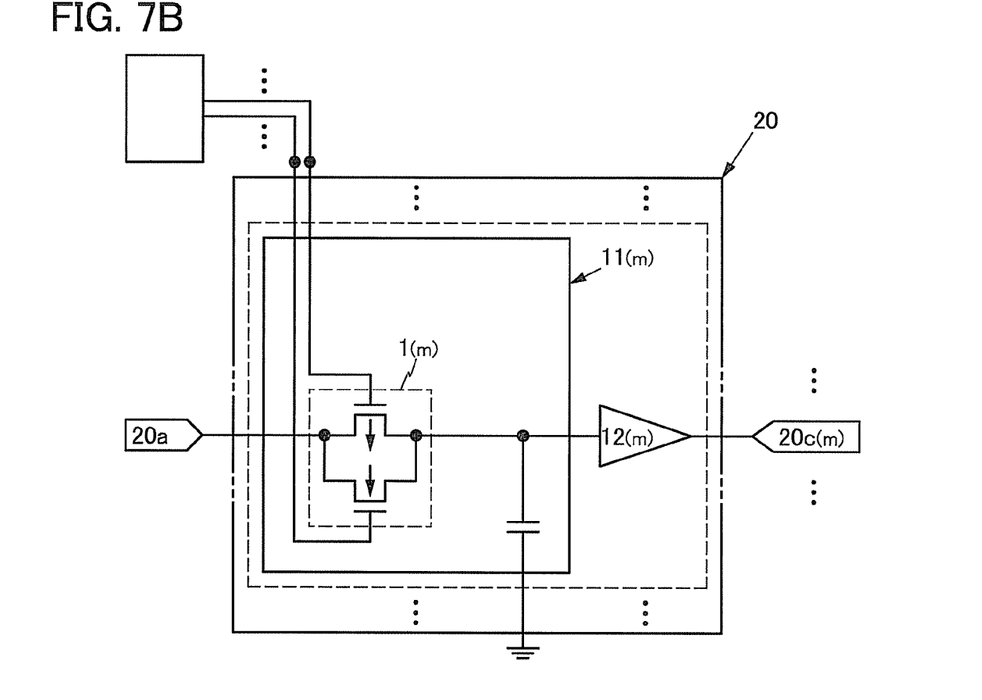

An example of a serial-parallel conversion circuit is shown in FIGS. 7A and 7B. FIG. 7A illustrates the entire structure of a serial-parallel conversion circuit, and FIG. 7B illustrates the structure of a sampling switch of one unit included in the serial-parallel conversion circuit. As shown in FIG. 7A, a serial-parallel conversion circuit 20 includes n (n is a natural number greater than 1) units in each of which a sampling switch and an amplifier are connected in series. For example, in a first unit 10(1), a first sampling switch 11(1) and a first amplifier 12(1) are connected in series. In addition, a first input portion 20a to which a serial signal is input, a second input portion 20b including n connection terminals to which a selection signal for sequentially selecting one unit from the n units is input, and an output portion 20c including n terminals from which a parallel signal is output are included. First input terminals of n sampling switches are each connected to the first input portion 20a. Second input terminals of the n sampling switches are each connected to any one of the n connection terminals included in the second input portion 20b. Output terminals of n amplifiers (specifically an output terminal 20c(1) of the first amplifier 12(1) to an nth output terminal 20c((n)) of the nth amplifier 12((n))) are each connected to any one of the n terminals of the output portion 20c independently. Further, the sampling switch outputs part of the serial signal to the amplifier connected to the sampling switch while being selected by the selection signal. The amplifier amplifies part of the serial signal and outputs the amplified signal from the output terminal. Such a serial-parallel conversion circuit 20 is known.

REFERENCE

Patent Document

[Patent Document 1] Japanese Published Patent Application No. 2011-237644

SUMMARY OF THE INVENTION

A serial signal having high frequency is sensitive to a delay occurring in a serial-parallel conversion circuit. For example, a parasitic capacitance of a transistor used as a sampling switch of a serial-parallel conversion circuit causes a delay of a signal in some cases.

FIG. 7B exemplifies the structure of an mth (m is a natural number greater than or equal to 1 and less than or equal to n) sampling switch 11((m)) included in the serial-parallel conversion circuit 20. With the sampling switch 11((m)), a serial signal that is input to the first input portion 20a is output to the amplifier 12((m)) through an analog switch 1((m)). The analog switch 1((m)) is configured to connect two transistors to an input terminal for a signal; therefore, when an analog switch is used for each of the n sampling switches of the serial-parallel conversion circuit 20, a parasitic capacitance of 2n transistors is applied to the first input portion 20a of the serial-parallel conversion circuit 20. As a result, the serial-parallel conversion circuit 20 might be prevented from operating at high speed.

One embodiment of the present invention is made in view of the foregoing technical background. One object is to provide a serial-parallel conversion circuit for converting a high-speed serial signal to a parallel signal. Another object is to provide a display device with high image quality and fewer external connection terminals. Another object is to provide a method for driving a serial-parallel conversion circuit for converting a high-speed serial signal to a parallel signal.

In order to solve any of the above objects, one embodiment of the present invention is made with a focus on the structure of a sampling switch of a unit in a serial-parallel conversion circuit. The present inventor conceived a serial-parallel conversion circuit including a structure exemplified in this specification. The serial-parallel conversion circuit of one embodiment of the present invention includes a plurality of units in each of which a sampling switch and an amplifier are connected in series. A serial signal and a selection signal are input to the sampling switch of each unit, and the sampling switch outputs part of the serial signal to the amplifier while being selected by the selection signal. Each sampling switch includes a first transistor, a second transistor, and a third transistor. The first transistor includes a gate electrode to which a first control signal is input, a first electrode to which a high power supply potential is supplied, and a second electrode that is connected to a first electrode of the second transistor. The second transistor includes a gate electrode to which a second control signal that is an inversion signal of the first control signal is input, a second electrode to which a ground potential is supplied, and the first electrode that is connected to the second electrode of the first transistor. The third transistor includes a first electrode to which a serial signal is supplied, a second electrode that is connected to its respective amplifier, and a gate electrode that is connected to the second electrode of the first transistor.

That is, a serial-parallel conversion circuit of one embodiment of the present invention includes a first input portion to which a serial signal is input, a second input portion to which a selection signal is input, a plurality of units, and an output portion that outputs a parallel signal that is converted from the serial signal. Each of the plurality of units includes a sampling switch for outputting part of the input serial signal while the sampling switch is selected by the selection signal and an amplifier for amplifying the part of the serial signal to output the amplified signal to its respective terminal of a plurality of terminals of the output portion. Note that the selection signal includes a first control signal and a second control signal that is an inversion signal of the first control signal. The sampling switch includes a first transistor, a second transistor, a third transistor, and a storage capacitor. The first transistor includes a gate electrode that is electrically connected to a first control signal line and a first electrode that is electrically connected to a high power supply potential line. The second transistor includes a gate electrode that is electrically connected to a second control signal line, a first electrode that is electrically connected to a second electrode of the first transistor, and a second electrode that is electrically connected to a ground potential line. The third transistor includes a gate electrode that is electrically connected to the second electrode of the first transistor and a first electrode that is electrically connected to the first input portion. The storage capacitor includes a first electrode that is electrically connected to a second electrode of the third transistor and a second electrode that is electrically connected to a ground potential line. The first transistor, the second transistor, and the third transistor each include an n-type crystalline silicon film. The high power supply potential line is supplied with a high power supply potential, and the ground potential line is supplied with a ground potential. Output terminals of the plurality of units are independently connected to the plurality of terminals.

The serial-parallel conversion circuit of one embodiment of the present invention includes a plurality of units in each of which a sampling switch and an amplifier are connected to each other. Each sampling switch outputs part of a serial signal to its respective amplifier only through one transistor (specifically the third transistor). Thus, a parasitic capacitance applied to an input portion is reduced as compared to the case of using an analog switch. As a result, the serial-parallel conversion circuit can operate at high speed. Thus, a serial-parallel conversion circuit for converting a high-speed serial signal to a parallel signal can be provided.

A display device of one embodiment of the present invention includes, over one element substrate, the serial-parallel conversion circuit to which a serial signal and a selection signal are input and from which a parallel signal is output, an external connection terminal to which the serial signal is input, a control circuit from which the selection signal is output, a signal line driver circuit to which the parallel signal is supplied, pixels that are electrically connected to the signal line driver circuit, and a scanning line driver circuit that is electrically connected to the pixels. The pixels are arranged in a matrix to form a pixel region. In addition, in the display device, RC of a load between a first external connection terminal and the serial-parallel conversion circuit satisfies a formula (1) below:

[Formula 1]

$$RC < \frac{1}{3 \cdot H \cdot V \cdot fps \cdot \ln(2n)} \quad (1)$$

In the formula, H represents the number of pixels provided for one scanning line (also called the number of pixels in the horizontal direction), V represents the number of scanning lines (also called the number of pixels in the vertical direction), fps represents a frame rate, and n represents the number of grayscale levels.

The display device of one embodiment of the present invention includes the serial-parallel conversion circuit of one embodiment of the present invention which is capable of converting a high-speed serial signal to a parallel signal. Thus, a serial signal having high frequency can be stably received. As a result, the display device with high image quality and fewer terminals can be provided.

A method for driving the serial-parallel conversion circuit includes a step of inputting a selection signal for setting the potential of the first control signal line at a high level and the potential of the second control signal line at a low level, so that the potential of the first electrode of the storage capacitor corresponds to the potential of the serial signal, then inputting a selection signal for setting the potential of the first control signal line at a low level and the potential of the second control signal line at a high level to maintain the potential of the first electrode of the storage capacitor. The above-described step is performed on the plurality of units one by one, and this operation is repeated.

In a method for driving the serial-parallel conversion circuit of one embodiment of the present invention, one unit is sequentially selected from the first to the nth units, so that the potential of a node j of a sampling switch in the selected unit corresponds to the potential of the serial signal. As a result, the method for driving the serial-parallel conversion circuit for converting a high-speed serial signal to a parallel signal can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device, a light-emitting unit, or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

In accordance with one embodiment of the present invention, a serial-parallel conversion circuit for converting a high-speed serial signal to a parallel signal can be provided. Further, a display device with high image quality and fewer external connection terminals can be provided. Furthermore, a method for driving a serial-parallel conversion circuit for converting a high-speed serial signal to a parallel signal can be provided.

DETAILED DESCRIPTION OF THE INVENTION

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

(Embodiment 1)

Figure 1A:
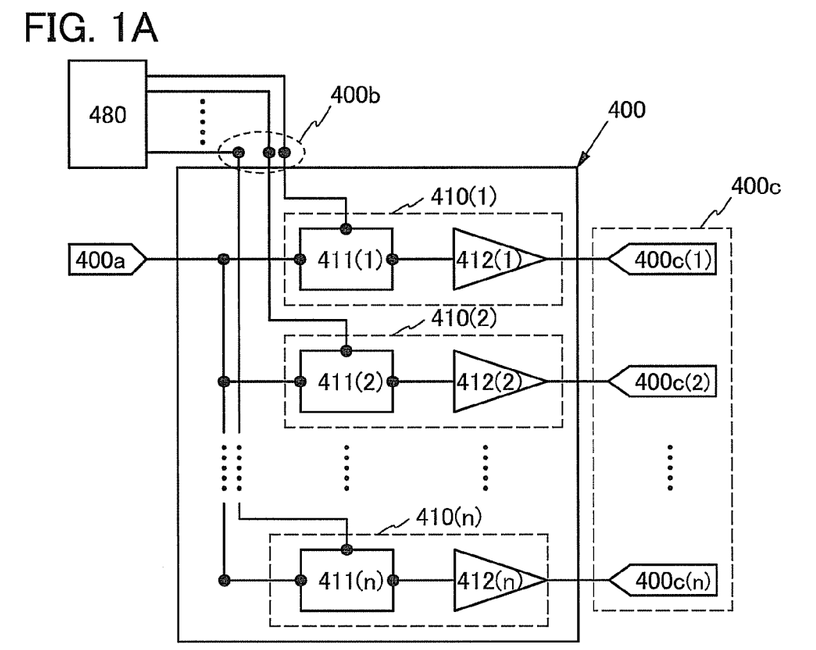
FIGS. 1A and 1B illustrate a serial-parallel conversion circuit according to an embodiment.
Figure 1B:
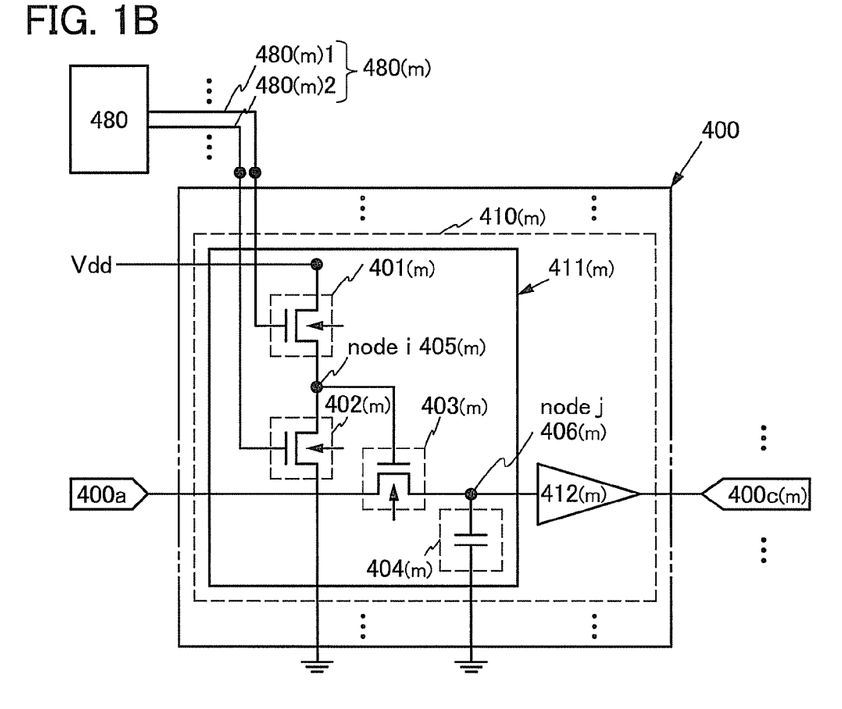

In this embodiment, the configuration of a serial-parallel conversion circuit of one embodiment of the present invention is described with reference to FIGS. 1A and 1B. FIG. 1A illustrates the entire configuration of a serial-parallel conversion circuit 400. FIG. 1B illustrates the configuration of an mth sampling switch of an mth unit included in the serial-parallel conversion circuit 400.

The serial-parallel conversion circuit 400 of one embodiment of the present invention which is shown in FIG. 1A includes a first input portion 400a to which a serial signal is input, a second input portion 400b to which a selection signal is input, and n (n is a natural number greater than 1) units each including a sampling switch and an amplifier. For example, in a first unit 410(1), a first sampling switch 411(1) and a first amplifier 412(1) are connected in series. The sampling switch outputs part of an input serial signal while being selected by the selection signal. The amplifier amplifies the part of the serial signal and outputs the amplified signal to a terminal. The second input portion 400b includes n connection terminals, and a selection signal is input to the second input portion 400b. An output portion 400c includes n terminals (e.g., an output terminal 400c(1)) and outputs a parallel signal.

First input terminals of the n sampling switches are each connected to the first input portion 400a. Second input terminals of the n sampling switches are each connected to any one of n sets of connection terminals of the second input portion. Output terminals of the n amplifiers (specifically an output terminal 400c(1) of the first amplifier 412(1) to an output terminal 400c((n)) of an nth amplifier 412((n))) are each connected to any one of the n terminals of the output portion independently. Further, while being selected by the selection signal, the sampling switch outputs the part of the serial signal to the amplifier connected to the sampling switch, and the amplifier outputs a potential corresponding to the part of the serial signal from the output terminal. The serial-parallel conversion circuit has such a configuration.

Note that the selection signal is a signal for sequentially selecting one unit from the n units. The selection signal includes a first control signal and a second control signal that is an inversion signal of the first control signal. For example, a selection signal 480((m)) (m is a natural number greater than or equal to 1 and less than or equal to n) that is input to an mth unit 410((m)) includes a first control signal 480((m))1 and a second control signal 480((m))2 that is an inversion signal of the first control signal 480((m))1 (see FIG. 1B). The sampling switch is selected by a selection signal including a first control signal at a high level and a second control signal at a low level.

The n sampling switches each have a similar configuration to an mth sampling switch 411((m)) exemplified in FIG. 1B. Specifically, the mth sampling switch 411((m)) includes a first transistor 401((m)), a second transistor 402((m)), a third transistor 403((m)), and a storage capacitor 404((m)). Note that the first transistor 401((m)), the second transistor 402((m)), and the third transistor 403((m)) each have an n-type crystalline silicon film.

The first transistor 401((m)) includes a gate electrode which is connected to a first control signal line, a first electrode which is connected to a high power supply potential line, and a second electrode which is connected to a node i 405((m)). Note that in this specification, a first electrode of a transistor is one of a source electrode and a drain electrode, and a second electrode of the transistor is the other of the source electrode and the drain electrode.

The second transistor 402((m)) includes a gate electrode which is connected to a second control signal line, a first electrode which is connected to the node i 405((m)), and a second electrode which is connected to a ground potential line.

The third transistor 403((m)) includes a gate electrode which is connected to the node i 405((m)), a first electrode which is connected to the first input portion 400a, and a second electrode which is connected to a node j 406((m)).

The storage capacitor 404((m)) includes a first electrode which is connected to the node j 406((m)) and a second electrode which is connected to a ground potential line. An amplifier 412((m)) includes an input terminal which is connected to the node j 406((m)). The first control signal line is supplied with the first control signal 480((m))1. The second control signal line is supplied with the second control signal 480((m))2. The high power supply potential line is supplied with a high power supply potential Vdd. The ground potential line is supplied with a ground potential.

In addition, FIG 1A shows a second unit 410(2) in which a second sampling switch 411(2) and a second amplifier 412(2) are connected in series and a unit 410((n)) in which an nth sampling switch 411((n)) and an nth amplifier 412((n)) are connected in series. Further, an output terminal 400c(2) of the second amplifier and an output terminal 400c((n)) of the nth amplifier are shown. Furthermore, in each of FIGS. 1A and 1B, a control circuit 480 of the serial-parallel conversion circuit 400 of one embodiment of the present invention is shown.

The serial-parallel conversion circuit 400 exemplified in this embodiment includes the n units in each of which the sampling switch is connected to its respective amplifier. Each sampling switch outputs the part of the serial signal to its respective amplifier through only one transistor (specifically the third transistor). Such a configuration can reduce a parasitic capacitance of the input portion as compared to the case of using an analog switch. As a result, the serial-parallel conversion circuit can operate at high speed. Thus, a serial-parallel conversion circuit for converting a high-speed serial signal to a parallel signal can be provided.

Each component of the serial-parallel conversion circuit 400 of one embodiment of the present invention is described below.

<Transistor in Sampling Switch>

The serial-parallel conversion circuit 400 of one embodiment of the present invention includes the n sampling switches each having the first transistor, the second transistor, and the third transistor. Each transistor includes an n-type crystalline silicon film with high mobility as a channel formation region. Thus, even a serial signal input at high frequency can be converted to a parallel signal.

Instead of the crystalline silicon film, any of a variety of single crystal semiconductors can be used. When a channel formation region of the transistor is formed using a single crystal semiconductor, the serial-parallel conversion circuit 400 can operate at high speed.

As a single crystal semiconductor, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon on insulator (SOI) substrate in which a single crystal semiconductor layer is provided on an insulating surface.

As a method for forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor layer is formed on an insulating surface by crystal growth; and the like.

In this embodiment, ions are added through one surface of a single crystal semiconductor substrate, and an embrittlement layer is formed at a certain depth from the surface of the single crystal semiconductor substrate. Then, an insulating layer is formed over the surface of the single crystal semiconductor substrate or over an element substrate on which the serial-parallel conversion circuit is to be formed. Next, heat treatment is performed in the state in which the single crystal semiconductor substrate provided with the embrittlement layer and the element substrate are bonded to each other with the insulating layer interposed therebetween, so that a crack is generated in the embrittlement layer to separate the single crystal semiconductor substrate along the embrittlement layer. Thus, a single crystal semiconductor layer, which is separated from the single crystal semiconductor substrate, is formed as a semiconductor layer over the element substrate. Note that a glass substrate or the like can be used for the element substrate on which the serial-parallel conversion circuit is to be formed.

Regions electrically insulated from each other may be formed in the semiconductor substrate, and the transistor included in the serial-parallel conversion circuit may be formed using the regions electrically insulated from each other.

The transistor included in the sampling switch and the transistor included in the amplifier or a transistor included in the control circuit 480 can be integrated and formed in the same step. Thus, the number of steps is reduced, so that manufacture of the serial-parallel conversion circuit 400 and a circuit in its periphery is facilitated.

The control circuit 480 sequentially selects one unit from the n units and outputs the selection signal including the first control signal and the second control signal that is an inversion signal of the first control signal.

For the control circuit 480, a shift register can be used, for example. In the case of using a shift register for the control circuit 480, a clock signal and a start pulse signal may be supplied to the control circuit 480 from the outside.

This embodiment can be combined with any of the other embodiments in this specification as appropriate.

(Embodiment 2)

In this embodiment, a method for driving a serial-parallel conversion circuit of one embodiment of the present invention is described with reference to FIGS. 1A and 1B and FIGS. 2A to 2G.

Specifically, a method for driving the serial-parallel conversion circuit 400 exemplified in Embodiment 1 is described. The following step is performed on the n units sequentially.

The step to be repeated is as follows. First, the selection signal 480((m)) (m is a natural number greater than or equal to 1 and less than or equal to n) including the first control signal 480((m))1 at a high level and the second control signal 480((m))2 at a low level is input to only the mth unit, so that the potential of the node j 406((m)) of the mth sampling switch corresponds to the potential of the serial signal input to the first input portion 400a (see FIG. 1B). Next, the selection signal 480((m)) including the first control signal 480((m))1 at a low level and the second control signal 480((m))2 at a high level is input to maintain the potential at the node j 406((m)).

The method for driving the serial-parallel conversion circuit of one embodiment of the present invention includes a step of sequentially selecting one unit from the first unit to the nth unit, so that the potential of the node j of the sampling switch in the selected unit corresponds to the potential of the serial signal. Thus, a method for driving a serial-parallel conversion circuit for converting a high-speed serial signal to a parallel signal can be provided.

A method for driving the serial-parallel conversion circuit 400 of one embodiment of the present invention is described in detail below.

FIGS. 2A to 2G are timing diagrams explaining the method for driving the serial-parallel conversion circuit 400 of one embodiment of the present invention which is exemplified in FIGS. 1A and 1B. In this embodiment, p (p is a natural number greater than or equal to 1 and less than or equal to n−1) and (p+1) are used as examples of m. In the description of this embodiment, FIG. 1B can be used when m, which represents the ordinal number of a reference numeral shown in FIG. 1B, is replaced with p or (p+1) as appropriate. Note that a potential at the first input portion 400a or the node j (m) is greater than or equal to y (V) and less than or equal to (Vdd−x) (V). Here, x and y may be greater than or equal to zero so that the amplifier can output. For example, x and y can be 0.5 when Vdd=3. A negative potential can be applied to the ground potential line. The application of a negative potential to the ground potential line enables the sampling switch to operate stably in the case where a threshold voltage of the transistor varies or fluctuates, for example. Note that with the first control signal 480((m))1 and the second control signal 480((m))2, the ground potential can be at a low level and the high power supply potential Vdd can be at a high level.

Figure 2A:
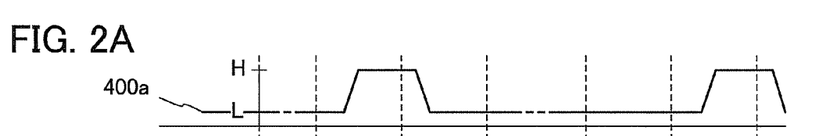
FIGS. 2A to 2G illustrate a method for driving a serial-parallel conversion circuit according to an embodiment.

FIG. 2A is a diagram explaining a potential at the first input portion 400a; the serial signal input to the serial-parallel conversion circuit 400 is represented.

Figure 2B:
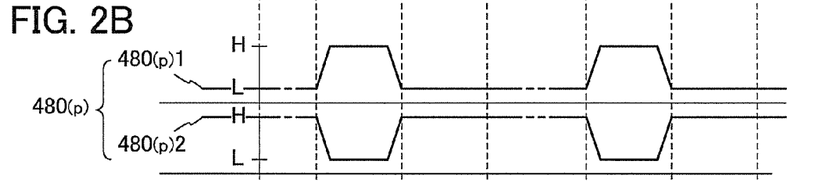

FIG. 2B is a diagram explaining a selection signal 480((p)) for selecting a pth unit. The selection signal 480((p)) includes a first control signal 480((p))1 shown in the upper part of FIG. 2B and a second control signal 480((p))2 shown in the lower part of FIG. 2B.

Figure 2C:
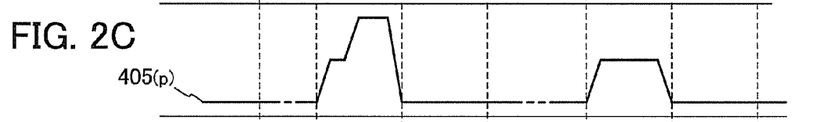

FIG. 2C is a diagram explaining a potential at a node i 405((p)) of a sampling switch 411((p)) in the pth unit.

Figure 2D:
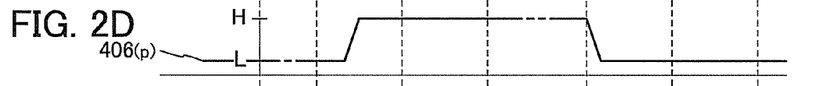

FIG. 2D is a diagram explaining a potential at a node j 406((p)) of the sampling switch 411((p)) in the pth unit.

Figure 2E:
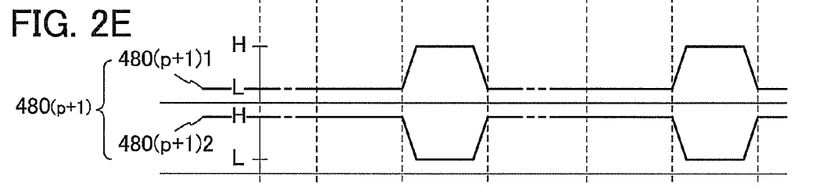

FIG. 2E is a diagram explaining a selection signal 480(p+1) for selecting a (p+1)th unit. The selection signal 480(p+1)

includes a first control signal 480(p+1)1 shown in the upper part of FIG. 2E and a second control signal 480(p+1)2 shown in the lower part of FIG. 2E.

Figure 2F:
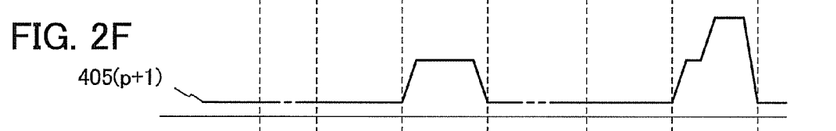

FIG. 2F is a diagram explaining a potential at a node i 405(p+1) of a sampling switch 411(p+1) in the (p+1)th unit.

Figure 2G:
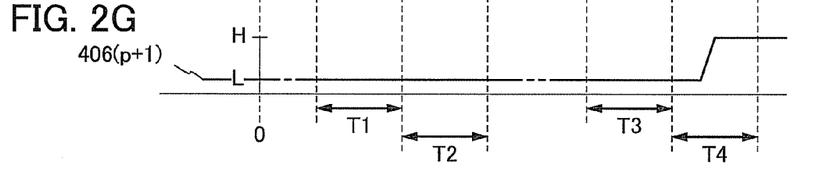

FIG. 2G is a diagram explaining a potential at a node j 406(p+1) of the sampling switch 411(p+1) in the (p+1)th unit.

<Operation in Period T1>

Operation in period T1 is described with reference to FIG. 1B and FIGS. 2A to 2G. Note that m which is added to a reference numeral in FIG. 1B is replaced with p for description.

A potential of the first control signal 480((p))1 of the selection signal 480((p)) is set to a high level, and a potential of the second control signal 480((p))2 of the selection signal 480((p)) is set to a low level; thus, the pth sampling switch 411((p)) in the pth unit 410((p)) is selected.

A first transistor 401((p)) is turned on in response to the first control signal 480((p))1, and a second transistor 402((p)) is turned off in response to the second control signal 480((p))2. A potential at the pth node i 405((p)) of the pth sampling switch 411((p)) rises to a potential that is lower than the high power supply potential Vdd by a threshold voltage of the first transistor 401((p)); thus, the first transistor 401((p)) is turned off. The third transistor 403((p)) is turned on in response to the rise in the potential at the pth node i 405((p)). Here, the potential of the node j 406((p)) in the pth unit corresponds to the serial signal input to the first input portion 400a in period T1 (see FIG. 1B, FIG. 2C, and FIG. 2D).

Next, a potential of the first control signal 480((p))1 of the selection signal 480((p)) is set to a low level, and a potential of the second control signal 480((p))2 is set to a high level. In response to the selection signal 480((p)), the first transistor 401((p)) is turned off and the second transistor 402((p)) is turned on (see FIG. 1B and FIG. 2B).

The potential at the pth node i 405((p)) in the pth unit falls to the ground potential; thus, the third transistor 403((p)) is turned off. Here, the pth node j 406((p)) in the pth unit retains a potential corresponding to the serial signal input to the first input portion 400a (see FIG. 1B, FIG. 2C, and FIG. 2D).

Note that sampling switches in other units are turned off in period T1.

When the selection signal 480((p)) including the first control signal 480((p))1 at a high level and the second control signal 480((p))2 at a low level is input, a serial signal may be set to a lower potential (e.g., LOW). With the use of such a signal, a potential of the first electrode of the third transistor can be a lower potential (e.g., LOW), and a potential of the gate electrode (i.e., a potential at the pth node i 405((p)) in the pth unit) of the third transistor can be a potential that is lower than the high power supply potential Vdd by a threshold voltage of the, first transistor 401((p)).

After the signal is made in the above-described state, the serial signal at a higher potential (e.g., HIGH) is input to the first input portion 400a ; thus, the potential at the pth node i 405((p)) in the pth unit rises owing to a parasitic capacitance and a gate capacitance of the third transistor, so that a potential difference between the first electrode and the gate electrode can be retained. By this, a phenomenon where resistance due to the third transistor 403((p)) rises in accordance with a potential of the serial signal can be inhibited, an on-state resistance of the third transistor 403((p)) can be reduced, and an RC load of a sampling switch can be reduced. As a result, the serial-parallel conversion circuit can operate at high speed. Thus, a serial-parallel conversion circuit for converting a high-speed serial signal to a parallel signal can be provided.

<Operation in Period T2>

Operation in period T2 subsequent to period T1 is described with reference to FIG. 1B and FIGS. 2A to 2G. Note that m which is added to a reference numeral in FIG. 1B is replaced with (p+1) for description.

The selection signal 480(p+1) including the first control signal 480(p+1)1 at a high level and the second control signal 480(p+1)2 at a low level is input to only the (p+1)th unit. In response to the selection signal 480(p+1), the first transistor 401(p+1) is turned on and the second transistor 402(p+1) is turned off.

The potential at the (p+1)th node i 405(p+1) of the sampling switch 411(p+1) in the (p+1)th unit rises to a potential that is lower than the high power supply potential Vdd by a threshold voltage of the first transistor 401(p+1), whereby the third transistor 403(p+1) is turned on. Here, the potential of the node j 406(p+1) in the (p+1)th unit corresponds to the serial signal input to the first input portion 400a in period T2 (see FIG. 1B, FIG. 2F, and FIG. 2G).

Then, a potential of the first control signal 480(p+1)1 of the selection signal 480(p+1) is set to a low level, and a potential of the second control signal 480(p+1)2 of the selection signal 480(p+1) is set to a high level. In response to the selection signal 480(p+1), the first transistor 401(p+1) is turned off and the second transistor 402(p+1) is turned on (see FIG. 1B and FIG. 2E).

The potential at the (p+1)th node i 405(p+1) in the (p+1)th unit falls to the ground potential, whereby the third transistor 403(p+1) is turned off. Here, the potential of the (p+1)th node j 406(p+1) in the (p+1)th unit is maintained at a potential corresponding to the serial signal input to the first input portion 400a (see FIG. 1B, FIG. 2F, and FIG. 2G).

Note that sampling switches in other units do not operate in period T2.

<Operation in Period T3>

Period T3 is a period in which, after each of the n units in the serial-parallel conversion circuit 400 is selected once by the selection signal after period T1, the pth unit is selected again.

Operation of the pth unit in period T3 is the same as the operation in period T1; therefore, the description of period T1 is employed here and the detailed description is omitted. By the operation of the pth unit in period T3, the potential of the node j 406((p)) in the pth unit corresponds to the serial signal input to the first input portion 400a in period T3 (specifically a potential at a low level).

<Operation in Period T4>

Period T4 is a period in which, after each of the n units in the serial-parallel conversion circuit 400 is selected once by the selection signal after period T2, the (p+1)th unit is selected again.

Operation of the (p+1)th unit in period T4 is the same as the operation in period T2; therefore, the description of period T2 is employed here and the detailed description is omitted. By the operation of the (p+1)th unit in period T4, the potential of the node j 406(p+1) in the (p+1)th unit corresponds to the serial signal input to the first input portion 400a in period T4 (specifically a potential at a high level).

This embodiment can be combined with any of the other embodiments in this specification as appropriate.

(Embodiment 3)

In this embodiment, the structure of a display device of one embodiment of the present invention is described with reference to FIGS. 3A and 3B.

The display device exemplified in this embodiment includes a pixel region in which a plurality of pixels are arranged in a matrix, a scanning line driver circuit connected to the pixel region, a signal line driver circuit connected to the pixel region, a serial-parallel conversion circuit for outputting a parallel signal to the signal line driver circuit, a first external connection terminal for outputting a serial signal to the serial-parallel conversion circuit, and a control circuit for outputting a selection signal to the serial-parallel conversion circuit. In the display device, when an RC load between the first external connection terminal and the serial-parallel conversion circuit is represented by RC, RC satisfies a formula (1).

The serial-parallel conversion circuit is formed over an element substrate provided with the pixel region and includes the following: n (n is a natural number greater than or equal to 1) units in each of which a sampling switch and an amplifier are connected in series; a first input portion which inputs a serial signal to the n sampling switches in series; a second input portion which inputs, to the n sampling switches, a selection signal for sequentially selecting one unit from the n units; and an output portion which includes n output terminals of n amplifiers and outputs a parallel signal from the n output terminals.

In the serial-parallel conversion circuit, the sampling switch outputs part of the serial signal to its respective amplifier while being selected by the selection signal, and the amplifier outputs a potential corresponding to a potential of an input terminal to the output terminal; the selection signal includes a first control signal and a second control signal that is an inversion signal of the first control signal. Each of the sampling switches includes a first transistor, a second transistor, a third transistor, and a storage capacitor. Further, the first transistor, the second transistor, and the third transistor each include an n-type crystalline silicon film.

The first transistor includes a gate electrode which is connected to a first control signal line, a first electrode which is connected to a high power supply potential line, and a second electrode which is connected to a node i.

The second transistor includes a gate electrode which is connected to a second control signal line, a first electrode which is connected to the node i, and a second electrode which is connected to a ground potential line.

The third transistor includes a gate electrode which is connected to the node i, a first electrode which is connected to the first input portion, and a second electrode which is connected to a node j.

The storage capacitor includes a first electrode which is connected to the node j and a second electrode which is connected to the ground potential line.

The n amplifiers each include an input terminal which is connected to the node j. The first control signal is supplied to the first control signal line. The second control signal is supplied to the second control signal line. A high power supply potential is supplied to the high power supply potential line. A ground potential is supplied to the ground potential line.

The display device exemplified in this embodiment includes the serial-parallel conversion circuit of one embodiment of the present invention which is capable of converting a high-speed serial signal to a parallel signal. Specifically, the serial-parallel conversion circuit exemplified in Embodiment 1 is applicable. Thus, a serial signal having high frequency can be stably received. As a result, the display device with high image quality and fewer terminals can be provided.

Further, in the display device exemplified in this embodiment, the serial-parallel conversion circuit and the external connection terminal for supplying a serial signal to the serial-parallel conversion circuit are provided close to each other so that the RC load between the serial-parallel conversion circuit and the external connection terminal is reduced. Accordingly, a serial signal having high frequency can be stably received.

As a result, the display device with high image quality and fewer terminals can be provided.

The structure of the display device exemplified in this embodiment will be described with reference to FIGS. 3A and 3B, FIGS. 4A and 4B, and FIG. 5.

Figure 3A:
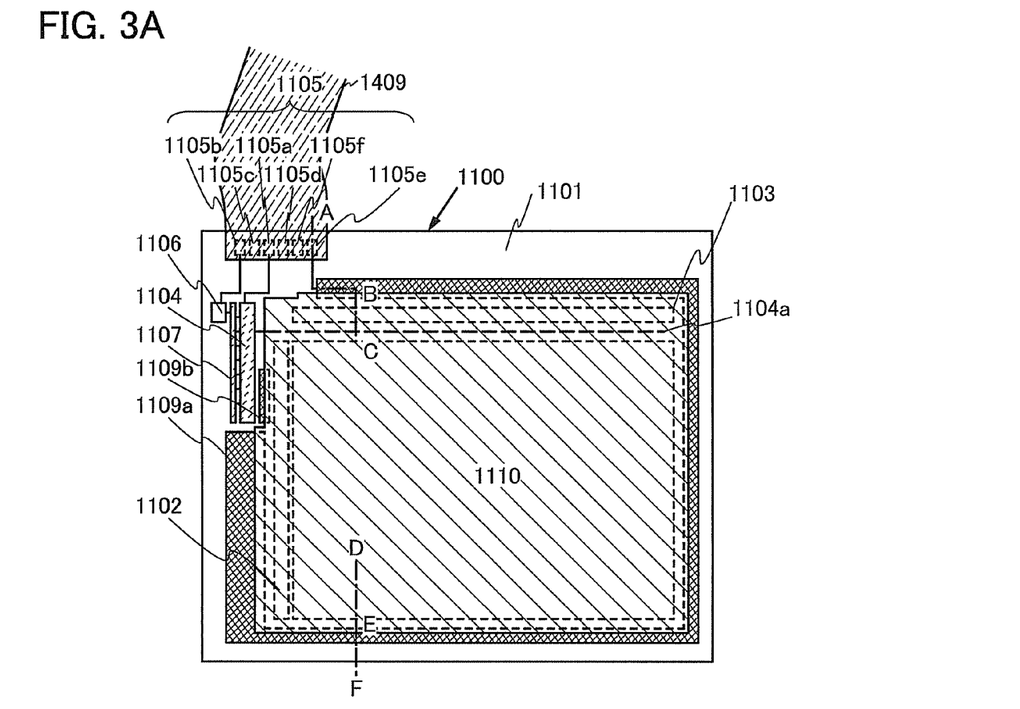
FIGS. 3A and 3B illustrate the structure of a display device according to an embodiment.
Figure 3B:
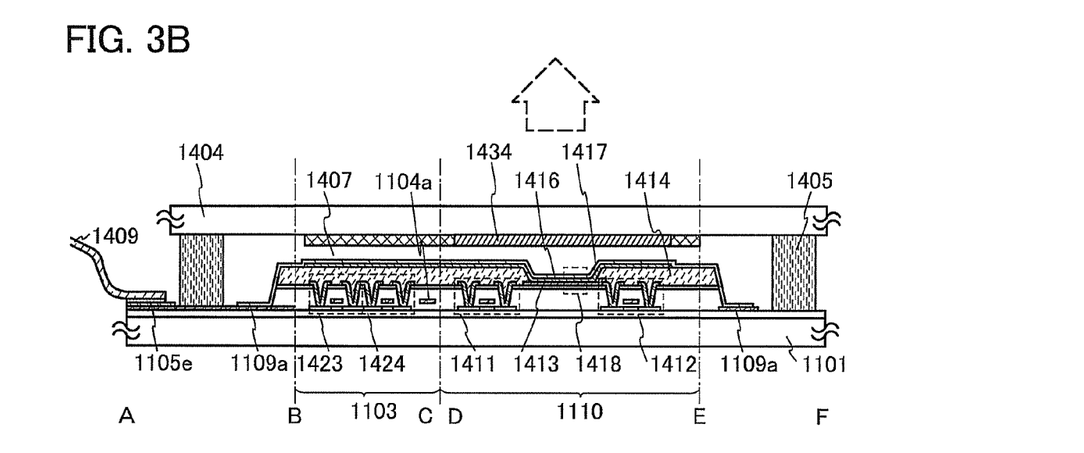

FIG. 3A is a top view showing the arrangement of elements included in the display device of one embodiment of the present invention, and FIG. 3B is a cross-sectional view taken along line A-B-C and line D-E-F in FIG. 3A.

Figure 4A:
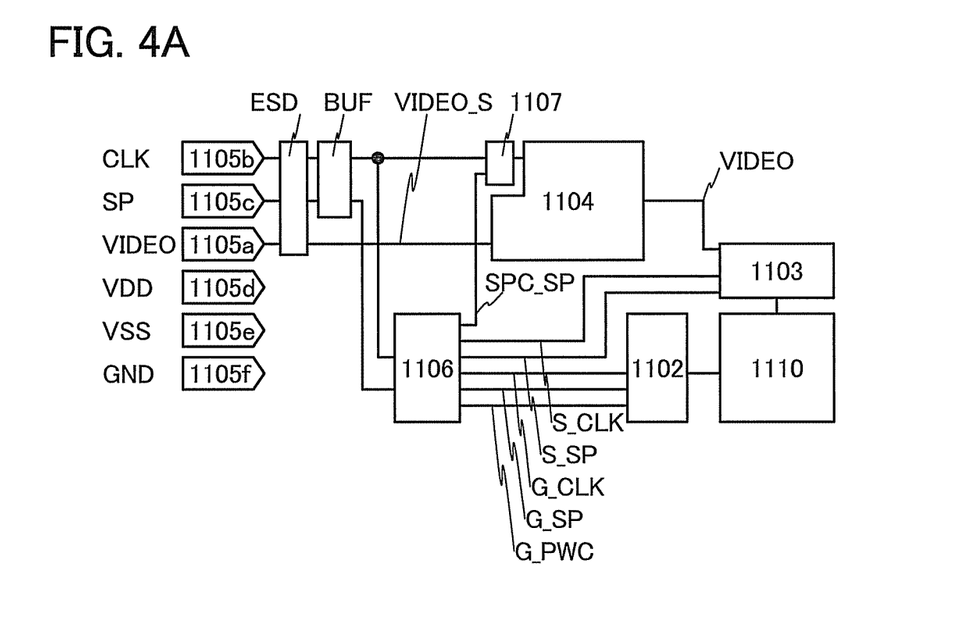
FIGS. 4A and 4B are block diagrams illustrating the structure of a display device according to an embodiment.
Figure 4B:
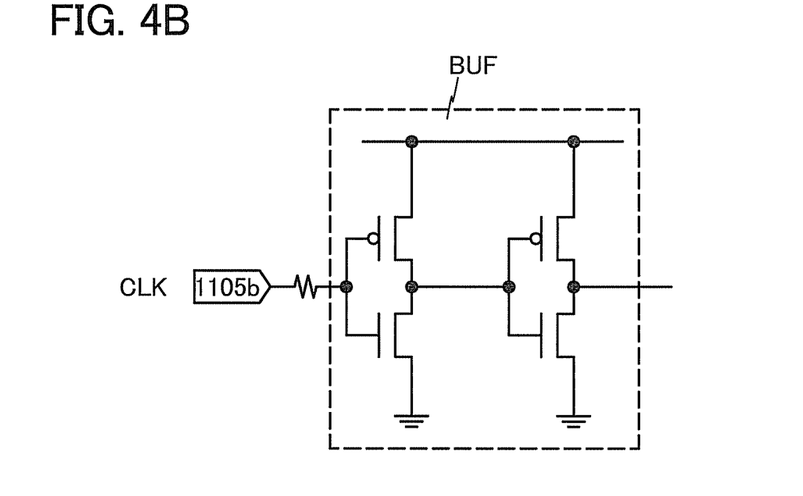

FIGS. 4A and 4B are block diagrams showing connection relations of elements included in the display device of one embodiment of the present invention.

Figure 5:
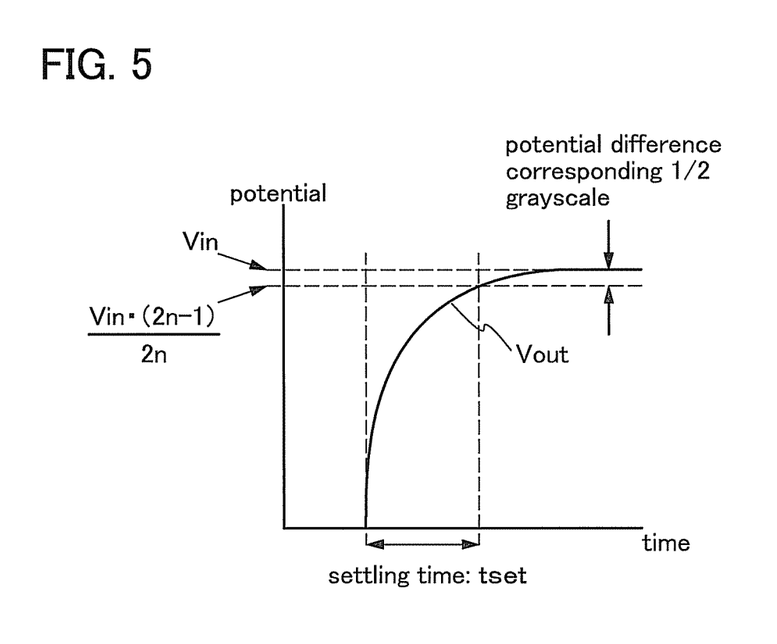
FIG. 5 is a conceptual diagram illustrating settling time according to an embodiment.

FIG. 5 is a conceptual diagram illustrating the behavior in which a serial signal Vin input to the external connection terminal is input to a serial-parallel conversion circuit 1104 with delay owing to an RC load RC between the external connection terminal and the serial-parallel conversion circuit.

A display device 1100 exemplified in FIG. 3A includes a pixel region 1110 in which a plurality of pixels are arranged in a matrix, a scanning line driver circuit 1102 connected to the pixel region 1110, a signal line driver circuit 1103 connected to the pixel region 1110, the serial-parallel conversion circuit 1104 for supplying a parallel signal to the signal line driver circuit 1103, a first external connection terminal 1105*a* for supplying a serial signal to the serial-parallel conversion circuit 1104, and a control circuit 1107 for outputting a selection signal to the serial-parallel conversion circuit. The serial-parallel conversion circuit 1104 includes a transistor having a crystalline silicon film formed over an element substrate 1101 provided with the pixel region. When an RC load between the first external connection terminal 1105*a* and the serial-parallel conversion circuit 1104 is represented by RC, RC satisfies the formula (1).

The display device 1100 includes an external connection terminal group 1105. The external connection terminal group 1105 includes the first external connection terminal 1105*a*, a second external connection terminal 1105*b*, a third external connection terminal 1105*c*, a fourth external connection terminal 1105*d*, a fifth external connection terminal 1105*e*, and a sixth external connection terminal 1105*f*. Note that the external connection terminal group 1105 is electrically connected to an external connection line 1409.

The display device 1100 further includes a timing signal generation circuit 1106, a common connection portion 1109*a*, and a common connection portion 1109*b*.

Note that in FIG. 3A, part of the structure shown in FIG. 3B is omitted for convenience of description. Specifically, a counter substrate 1404 provided with a color filter 1434 and a sealing material 1405 are omitted.

FIG. 3B shows the structure of the cross section of the display device 1100. In the pixel region 1110, the cross section of one pixel is shown. One pixel includes a transistor 1411, a transistor 1412, and a light-emitting element 1418. The light-emitting element 1418 includes a first electrode 1413, a second electrode 1417, and a layer 1416 containing a light-emitting organic compound between the first electrode and the second electrode.

One of the first electrode 1413 and the second electrode 1417 transmits light emitted from the layer containing a light-emitting organic compound. In the light-emitting element exemplified in this embodiment, the second electrode 1417 has a light-transmitting property, so that light is extracted from the second electrode side.

The first electrode 1413, the edge portion of which is covered with a partition wall 1414, is electrically connected to a source electrode or a drain electrode of the transistor 1412. The second electrode 1417, which is extended to the outside of the pixel region 1110, is electrically connected to a common wiring through the common connection portion 1109*a*. Note that the common wiring is electrically connected to the fifth external connection terminal 1105*e*.

The signal line driver circuit 1103 includes a transistor 1423 and a transistor 1424.

Transistors included in the pixels of the pixel region 1110, the scanning line driver circuit 1102, or the signal line driver circuit 1103 and transistors included in the serial-parallel conversion circuit 1104 and the timing signal generation circuit 1106 can be integrated and formed in the same step. Thus, the number of steps is reduced, so that the display device 1100 with high image quality can be easily manufactured.

Alternatively, the transistors included in the pixels of the pixel region 1110 may be formed in a step which is different from a step of forming the transistors included in the serial-parallel conversion circuit 1104 and the timing signal generation circuit 1106. For example, the transistors included in the pixels of the pixel region 1110 can be transistors each having an amorphous semiconductor film, transistors each having a polycrystalline semiconductor film, or transistors each having an oxide semiconductor film.

As an amorphous semiconductor, hydrogenated amorphous silicon can be typically given. As a polycrystalline semiconductor, polysilicon (polycrystalline silicon) and the like can be typically given. Examples of polysilicon include so-called high-temperature polysilicon that contains polysilicon as a main component and is formed at a process temperature greater than or equal to 800° C., so-called low-temperature polysilicon that contains polysilicon as a main component and is formed at a process temperature less than or equal to 600° C., polysilicon obtained by crystallizing amorphous silicon by using an element that promotes crystallization or the like, and the like. It is needless to say that a microcrystalline semiconductor or a semiconductor which includes a crystal phase in part of a semiconductor layer can also be used.

Further, an oxide semiconductor may be used. As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Furthermore, any of the above oxide semiconductors may contain an element other than In, Ga, Sn, and Zn, for example, Si.

Here, for example, an In—Ga—Zn-based oxide semiconductor means an oxide semiconductor containing indium (In), gallium (Ga), and zinc (Zn), and there is no limitation on the composition ratio thereof.

The off-state current of a transistor having a channel formation region formed using an oxide semiconductor film can be very small. Therefore, a memory element can be formed using the transistor. Specifically, a transistor including an oxide semiconductor film is used as a selection transistor in each pixel of the pixel region 1110, and a source electrode or a drain electrode of the transistor is connected to a gate electrode of a driving transistor for driving a display element. The off-state current of the selection transistor in each pixel is very small; therefore, an image signal that is input is stored as a potential of the gate electrode of the driving transistor. Accordingly, the pixel region 1110 can have a memory function. Thus, for example, the pixel region 1110 can store display data for one frame.

The display device 1100 includes the counter substrate 1404 and the sealing material 1405. The light-emitting element in the pixel region 1110 is sealed in a space 1407 enclosed by the element substrate 1101, the counter substrate 1404, and the sealing material 1405 surrounding the pixel region 1110.

On the counter substrate 1404 exemplified in this embodiment, the color filter 1434 is provided to overlap with the light-emitting element provided in the pixel of the pixel region 1110. The light-emitting element provided in the pixel emits white light. A color filter that transmits red light is provided for a pixel for expressing red, a color filter that transmits green light is provided for a pixel for expressing green, and a color filter that transmits blue light is provided for a pixel for expressing blue. Thus, a display device capable of full-color display can be provided.

FIG. 4A is a block diagram illustrating the structure of circuits in the display device 1100. In the figure, ESD represents a protection circuit, and BUF represents a buffer circuit. FIG. 4B illustrates one example of a buffer circuit. With the buffer circuit, a waveform whose rising edge is gradual can be shaped.

The first external connection terminal 1105*a* is a terminal for input of a serial signal VIDEO_S including an image signal from the outside of the display device 1100. The input serial signal VIDEO_S is supplied to the serial-parallel conversion circuit 1104 through the first external connection terminal 1105*a*.

The second external connection terminal 1105*b* is a terminal for input of a clock signal CLK from the outside of the display device 1100. The input clock signal CLK is supplied to the timing signal generation circuit 1106 and the control circuit 1107 through the second external connection terminal 1105*b*.

The third external connection terminal 1105*c* is a terminal for input of a start pulse signal SP from the outside of the display device 1100. The input start pulse signal SP is supplied to the timing signal generation circuit 1106 through the third external connection terminal 1105*c*.

The fourth external connection terminal 1105*d* is a terminal for input of a high power supply potential Vdd from the outside of the display device 1100. The high power supply potential Vdd is supplied to each element that needs the high power supply potential Vdd, through the fourth external connection terminal 1105*d*.

The fifth external connection terminal 1105*e* is a terminal for input of a low power supply potential Vss from the outside of the display device 1100. The low power supply potential Vss is supplied to each element that needs the low power supply potential Vss, through the fifth external connection terminal 1105*e*.

The sixth external connection terminal 1105*f* is a terminal for input of a ground potential GND from the outside, of the display device 1100. The ground potential GND is supplied to each element that needs the ground potential GND, through the sixth external connection terminal 1105*f*.

The timing signal generation circuit 1106 generates a serial-parallel conversion start pulse signal SPC_SP from the input clock signal CLK and the input start pulse signal SP to supply the serial-parallel conversion start pulse signal SPC_SP to the control circuit 1107. Similarly, from the input clock signal CLK and the input start pulse signal SP, the timing signal generation circuit 1106 generates a source clock signal S_CLK and a source start pulse signal S_SP to supply the source clock signal S_CLK and the source start pulse signal S_SP to the signal line driver circuit 1103, and generates a gate clock signal G_CLK, a gate start pulse signal G_SP, and a pulse width control signal G_PWC to supply the gate clock signal G_CLK, the gate start pulse signal G_SP, and the pulse width control signal G_PWC to the scanning line driver circuit 1102.

The control circuit 1107 generates a selection signal from the clock signal CLK and the serial-parallel conversion start pulse signal SPC_SP to supply it to the serial-parallel conversion circuit 1104.

The serial-parallel conversion circuit 1104 generates a parallel signal VIDEO including an image signal from the input serial signal VIDEO_S and selection signal to supply the parallel signal VIDEO to the signal line driver circuit 1103.

The display device 1100 exemplified in this embodiment includes the first external connection terminal for supplying a serial signal to the serial-parallel conversion circuit, the second external connection terminal for supplying a clock signal to the timing signal generation circuit, the third external connection terminal for supplying a start pulse signal to the timing signal generation circuit, the fourth external connection terminal to which a high power supply potential is supplied, the fifth external connection terminal to which a low power supply potential is supplied, and the sixth external connection terminal to which a ground potential is supplied. Thus, a self-luminous display device with high image quality and fewer terminals can be provided.

Elements included in the display device 1100 of one embodiment of the present invention will be described below. The display device 1100 exemplified in this embodiment is an active-matrix display device; however, one embodiment of the present invention is not limited thereto and is applicable to a passive-matrix display device.

<Pixel Region>

The pixel region 1110 includes V scanning lines each provided with H pixels. Each pixel includes three sub-pixels (specifically, a pixel R for expressing red, a pixel G for expressing green, and a pixel B for expressing blue) which are not shown.

The sub-pixels are provided at the intersections of the scanning lines and the signal lines. The sub-pixels are operated in accordance with a scanning line selection signal input from the scanning line and an image signal input from the signal line. Note that the sub-pixels exemplified in this embodiment each express n gray level.

The display device 1100 exemplified in this embodiment displays an image in the pixel region at a frame rate fps.

<Scanning Line Driver Circuit>

The scanning line driver circuit 1102 outputs a scanning line selection signal to each of the scanning lines provided in the pixel region 1110.

<Signal Line Driver Circuit>

The signal line driver circuit 1103 outputs an image signal to each of the signal lines provided in the pixel region 1110.

<Serial-Parallel Conversion Circuit>

The serial-parallel conversion circuit 1104, which includes a transistor having an n-type crystalline silicon film formed over the element substrate 1101, converts the input serial signal to a parallel signal and outputs the parallel signal to the signal line driver circuit 1103. For example, the serial-parallel conversion circuit exemplified in Embodiment 1 can be used for the serial-parallel conversion circuit 1104.

The display device 1100 exemplified in this embodiment is provided with the serial-parallel conversion circuit 1104 including the transistor which has the channel formation region formed using the n-type crystalline silicon film with high mobility and thus operates at high speed. Accordingly, even a serial signal input at high frequency can be converted to a parallel signal. As a result, the display device 1100 with high image quality and fewer terminals can be provided.

Further, a transistor having a channel formation region formed using the n-type crystalline silicon film formed over the element substrate 1101 is used. Accordingly, a wiring and a space for bonding can be omitted; thus, a wiring can be further shortened.

Instead of the n-type crystalline silicon film formed over the element substrate 1101, any of a variety of single crystal semiconductors can be used. When a channel formation region of a transistor is formed using a single crystal semiconductor, the serial-parallel conversion circuit 1104 can operate at high speed.

Transistors included in the pixel region 1110, the scanning line driver circuit 1102, the signal line driver circuit 1103, and the timing signal generation circuit 1106 and transistors included in the serial-parallel conversion circuit 1104 can be integrated and formed in the same step. Thus, the number of steps is reduced, so that the display device 1100 with high image quality can be easily manufactured.

The transistor having a channel formation region formed using a single crystal semiconductor is suitably used in a pixel of the pixel region 1110 together with a light-emitting element. This is because variation in electric characteristics such as threshold voltage of the transistor, which is caused by bonding defects at grain boundaries, can be reduced. Accordingly, in the display device of one embodiment of the present invention, the light-emitting element can normally operate even if a circuit for compensating threshold voltage is not provided in each pixel. The number of circuit elements per pixel can therefore be reduced, increasing the flexibility in layout. Thus, a high-resolution light-emitting device can be achieved. For example, a display device having a matrix of a plurality of pixels, specifically 350 pixels or more per inch (i.e., the horizontal resolution is 350 pixels per inch (ppi) or more), more preferably 400 or more pixels per one inch (i.e., the horizontal resolution is 400 ppi or more) can be achieved.

Moreover, a transistor having a channel formation region formed using a single crystal semiconductor can be downsized while keeping high current drive capability. The use of the downsized transistor leads to a reduction in the area of a circuit portion that does not contribute to display operation, resulting in an increase in the area of a region of the display portion where an image is displayed and a reduction in the frame size of the light-emitting device.

The signal line driver circuit 1103 is provided along a row of the pixel region 1110, and the scanning line driver circuit 1102 is provided along a column of the pixel region 1110. The serial-parallel conversion circuit 1104 is provided in a corner portion where the signal line driver circuit 1103 and the scanning line driver circuit 1102 are close to each other. The serial-parallel conversion circuit 1104 is provided more apart from the pixel region 1110 than the scanning line driver circuit 1102 is. A wiring 1104a is provided between the pixel region 1110 and the signal line driver circuit 1103 so as to extend along the row of the pixel region 1110. Through the wiring 1104a, a parallel signal is supplied from the serial-parallel conversion circuit 1104 to the signal line driver circuit.

In the display device 1100 exemplified in this embodiment, the serial-parallel conversion circuit 1104 is provided close to the signal line driver circuit 1103. Further, the wiring 1104a, through which the parallel signal is supplied from the serial-parallel conversion circuit 1104 to the signal line driver circuit 1103, is provided along the row of the pixel region. Accordingly, a wiring for connecting the serial-parallel conversion circuit 1104 to the signal line driver circuit 1103 can be shortened as compared to other arrangement, whereby delay can be made less likely to occur. As a result, the display device with high image quality and fewer terminals can be provided.

<RC Load RC>

An RC load RC between the first external connection terminal 1105a and the serial-parallel conversion circuit 1104 in the display device 1100 exemplified in this embodiment will be described.

It is necessary that settling time tset of the serial-parallel conversion circuit be shorter than allowable time tsamp for transmitting a signal to one sub-pixel.

In the case where the RC load RC is present between the first external connection terminal 1105a and the serial-parallel conversion circuit 1104, a signal input to the first external connection terminal 1105a is input to the serial-parallel conversion circuit 1104 with delay (see FIG. 5). When a signal with an amplitude Vin is input to the first external connection terminal 1105a, a signal Vout which is input to the serial-parallel conversion circuit 1104 with delay is changed depending on time t as expressed by a formula (2) below.

[Formula 2]

$$\frac{Vout}{Vin} = \left(1 - \exp\left(-\frac{t}{RC}\right)\right) \quad (2)$$

Here, as the signal with an amplitude Vin, an image signal with an amplitude corresponding to a maximum grayscale (nth grayscale level) is input to the first external connection terminal 1105a. In that case, settling time tset is defined as time in which Vout approaches Vin gradually and reaches a potential lower than Vin by ½ grayscale. Therefore, settling time tset can be expressed by a formula (3) below (see FIG. 5).

[Formula 3]

$$tset = -RC \cdot \ln\left(1 - \frac{Vin \cdot ((2n-1)/2n)}{Vin}\right) = RC \cdot \ln(2n) \quad (3)$$

Allowable time tsamp for transferring one analog signal to one sub-pixel is expressed by a formula (4) below.

[Formula 4]

$$tsamp = \frac{1}{3 \cdot H \cdot V \cdot fps}. \quad (4)$$

It is necessary that settling time tset be shorter than allowable time tsamp for transfer to one sub-pixel. Therefore, in the display device 1100 of one embodiment of the present invention, the RC load RC between the first external connection terminal 1105a and the serial-parallel conversion circuit 1104 satisfies the formula (1).

[Formula 5]

$$RC < \frac{1}{3 \cdot H \cdot V \cdot fps \cdot \ln(2n)} \quad (1)$$

In the formula (1), H represents the number of pixels provided for one scanning line (also called the number of pixels in the horizontal direction), V represents the number of scanning lines (also called the number of pixels in the vertical direction), fps represents a frame rate, and n represents the number of grayscale levels.

<Timing Signal Generation Circuit>

The timing signal generation circuit 1106 includes a transistor having a crystalline silicon film fanned over the element substrate 1101. The timing signal generation circuit 1106 generates timing signals from the clock signal input to the second external connection terminal 1105b and the start pulse signal input to the third external connection terminal 1105c and outputs the timing signals to the scanning line driver circuit 1102, the signal line driver circuit 1103, and the control circuit 1107.

The display device 1100 exemplified in this embodiment is provided with the timing signal generation circuit 1106 including the transistor which has the channel formation region formed using the crystalline silicon film with high mobility and thus operates at high speed. The timing signal generation circuit 1106 can generate two or more timing signals from the clock signal supplied through the second external connection terminal 1105b. Accordingly, the display device 1100 can be driven using two or more timing signals without an external connection terminal for a timing signal. As a result, the display device 1100 with high image quality and fewer terminals can be provided.

The transistors each having the crystalline silicon film formed over the element substrate 1101 can be formed in the same step. Accordingly, transistors included in the pixel region 1110, the scanning line driver circuit 1102, the signal line driver circuit 1103, the serial-parallel conversion circuit 1104, the control circuit 1107, and the timing signal generation circuit 1106 can be integrated. Thus, the number of steps is reduced, so that the display device 1100 with high image quality can be easily manufactured.

The timing signal generation circuit 1106 is provided in a position close to the second external connection terminal 1105b. Further, the timing signal generation circuit 1106 is provided adjacent to the control circuit 1107 and apart from the pixel region 1110.

In the display device 1100 exemplified in this embodiment, the timing signal generation circuit 1106 is provided in a position close to the second external connection terminal 1105b for supplying a clock signal. Further, the timing signal generation circuit 1106 is provided adjacent to the control circuit 1107 and apart from the pixel region 1110. Accordingly, a wiring for connecting the timing signal generation circuit 1106 to the second external connection terminal 1105b can be shortened as compared to other arrangement, whereby delay can be made less likely to occur. As a result, the display device with high image quality and fewer terminals can be provided.

<Light-emitting Element>

The light-emitting element 1418 is provided in the subpixel of the display device 1100 exemplified in this embodiment. The light-emitting element 1418 which is applicable to the display device 1100 exemplified in this embodiment includes the first electrode 1413, the second electrode 1417, and the layer 1416 containing a light-emitting organic compound between the first electrode 1413 and the second electrode 1417. One of the first electrode 1413 and the second electrode 1417 is an anode, and the other thereof is a cathode. When voltage higher than the threshold voltage of the light-emitting element 1418 is applied between the first electrode 1413 and the second electrode 1417, holes are injected from the anode and electrons are injected from the cathode to the layer 1416 containing a light-emitting organic compound. The injected holes and electrons are recombined, whereby the light-emitting organic compound emits light.

Here, a layer or a stacked body which includes one region where electrons and holes are recombined is referred to as a light-emitting unit. In the layer containing a light-emitting organic compound, at least one light-emitting unit can be included, and two or more light-emitting units may overlap with each other. For example, two light-emitting units are formed so that the color of light emitted from one of the two light-emitting units is complementary to the color of light emitted from the other of the two light-emitting units; thus, a light-emitting element that emits white light can be formed.

<Common Connection Portion>

The display device 1100 of one embodiment of the present invention includes a plurality of pixels in the pixel region 1110. Each of the pixels includes the light-emitting element 1418 including the first electrode 1413, the second electrode 1417, and the layer 1416 containing a light-emitting organic compound between the first electrode 1413 and the second electrode 1417.

The first electrode 1413, which is provided over the element substrate 1101, is supplied with power through the transistor 1412. Note that the pixels in the pixel region have similar structures.

The second electrode 1417, which is extended to the outside of the pixel region 1110, is supplied with power through the common connection portion 1109a and the common connection portion 1109b. Here, the common connection portion 1109a and the common connection portion 1109b are provided so as to surround the pixel region. Accordingly, voltage drop due to sheet resistance of the second electrode can be suppressed in the entire pixel region, whereby display unevenness can be reduced. As a result, the self-luminous display device with high image quality and fewer terminals can be provided. Note that the common connection portion 1109a and the common connection portion 1109b are electrically connected to each other through a conductive layer which overlaps with the common connection portion 1109a and the common connection portion 1109b but is not shown.

Particularly, in the case where the common connection portion 1109a having a larger width than the serial-parallel conversion circuit is provided on the serial-parallel conversion circuit side of the pixel region, the area of contact between the common connection portion 1109a and the second electrode 1417 is large. Thus, connection can be ensured. Further, the use of the common connection portion 1109a having a large width enables wiring resistance to be reduced.

This embodiment can be combined with any of the other embodiments in this specification as appropriate.

(Embodiment 4)

In this embodiment, examples of an electronic device to which a display device of one embodiment of the present invention is applied will be described with reference to FIGS. 6A to 6C.

Examples of the electronic device to which the display device is applied include television sets (also referred to as televisions or television receivers), monitors of computers or the like, digital cameras, digital video cameras, digital photo frames, mobile phones (also referred to as cell phones or cellular phones), portable game consoles, personal digital assistants, audio reproducing devices, and large-sized game machines such as pachinko machines.

Figure 6A:
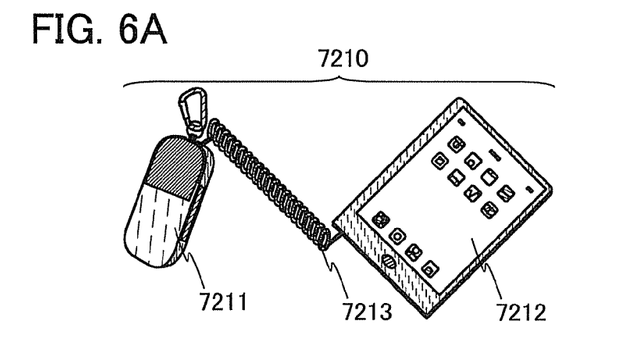
FIGS. 6A to 6C each illustrate an electronic device according to an embodiment.

FIG. 6A illustrates an example of a personal digital assistant. In a personal digital assistant 7210, a main body 7211 and a display device 7212 are connected to each other by a cable 7213. The cable 7213 transmits serial data including image data from the main body 7211 to the display device 7212 and transmits operation performed on the display device 7212 to the main body 7211. Further, the cable 7213 also has a function of preventing the display device from being damaged by being dropped.

Figure 6B:
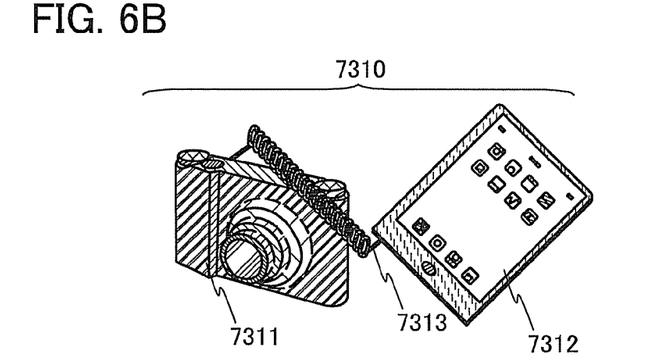

FIG. 6B illustrates an example of a digital camera. In a digital camera 7310, a main body 7311 and a display device 7312 are connected to each other by a cable 7313. The cable 7313 transmits serial data including image data from the main body 7311 to the display device 7312 and transmits operation performed on the display device 7312 to the main body 7311.

Figure 6C:
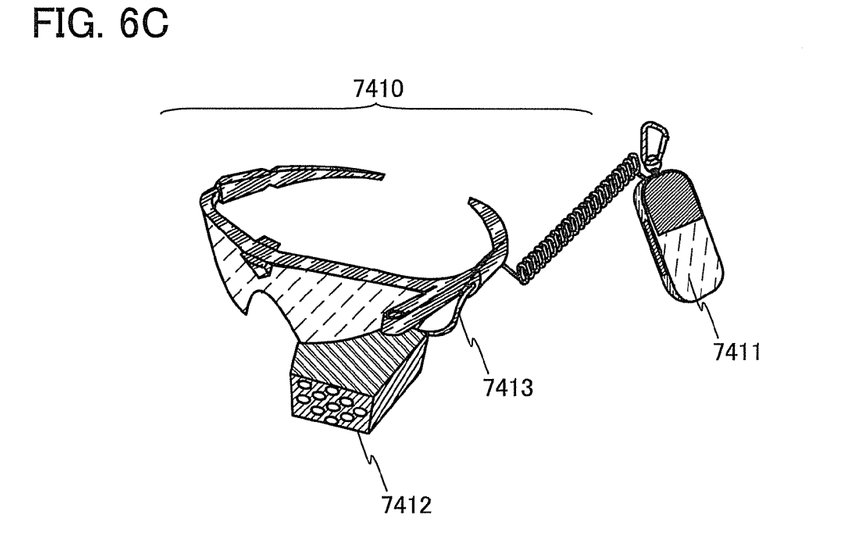

FIG. 6C illustrates an example of a head-mounted display. In a head-mounted display 7410, a main body 7411 and a display device 7412 are connected to each other by a cable 7413. The cable 7413 transmits serial data including image data from the main body 7411 to the display device 7412 set in a housing. Further, the movement of eyeball and eyelid of a user can be captured by a camera in the housing, and data on the movement can be transmitted to the main body 7411. From the data on the movement of the eyeball and the eyelid, coordinates of the points the user looks at are calculated in the main body 7411. Thus, the user can use the points for a pointing device.

In the display device of one embodiment of the present invention, the number of terminals is reduced, which leads to reduction in the number of wirings in a cable to be connected to an external device. In addition, the cable is bent with flexibility and the weight thereof is reduced. Thus, display can be seen with only a lightweight display portion held in a hand, for example, while a main body is put in a pocket or a bag. Further, the main body can be operated with the use of the display portion.

This embodiment can be combined with any of the other embodiments in this specification as appropriate.

This application is based on Japanese Patent. Application serial no. 2012-020538 filed with Japan Patent Office on Feb. 2, 2012, the entire contents of which are hereby incorporated by reference.

What is claimed is:

1. A semiconductor device comprising:
   a input portion;
   a first signal line;
   a second signal line;
   an output portion; and
   m units (m is a natural number greater than or equal to 1) each comprising:
      a first transistor;
      a second transistor;
      a third transistor;
      a capacitor; and
      an amplifier;

wherein a gate of the first transistor is electrically connected to the first signal line, wherein a gate of the second transistor is electrically connected to the second signal line, wherein one of a source of the first transistor and a drain of the first transistor is electrically connected to a first potential line, wherein one of a source of the second transistor and a drain of the second transistor is electrically connected to the other of the source of the first transistor and the drain of the first transistor, wherein the other of the source of the second transistor and the drain of the second transistor is electrically connected to a second potential line, wherein a gate of the third transistor is electrically connected to the other of the source of the first transistor and the drain of the first transistor, wherein one of a source of the third transistor and a drain of the third transistor is electrically connected to the input portion, wherein a first electrode of the capacitor is electrically connected to the other of the source of the third transistor and the drain of the third transistor, wherein a second electrode of the capacitor is electrically connected to a third potential line, wherein an input terminal of the amplifier is electrically connected to the other of the source of the third transistor and the drain of the third transistor, and wherein an output terminal of the amplifier is electrically connected to the output portion.

2. The semiconductor device according to claim 1, wherein the first transistor, the second transistor, and the third transistor each comprise an n-type crystalline silicon film.

3. The semiconductor device according to claim 1,
wherein the input portion is configured so that a serial signal is input to, and
wherein the output portion is configured to output a parallel signal converted from the serial signal.

4. The semiconductor device according to claim 1,
wherein a first control signal is input to the gate of the first transistor of a kth unit from the first signal line (k is a natural number greater than or equal to 1 and less than or equal to m), and
wherein a second control signal which is an inversion signal of the first control signal is input to the gate of the second transistor of the kth unit from the second signal line.

5. The semiconductor device according to claim 1,
wherein the second potential line is supplied with a ground potential, and
wherein the third potential line is supplied with a ground potential.

6. A serial-parallel conversion circuit comprising the semiconductor device according to claim 1.

7. A display device comprising:
a substrate;
the serial-parallel conversion circuit according to claim 6 over the substrate, the serial-parallel conversion circuit configured so that a serial signal is input to and configured to output a parallel signal;
an external connection terminal over the substrate, the external connection terminal configured so that the serial signal is input to;
a control circuit over the substrate, the control circuit configured to output a selection signal;
a signal line driver circuit over the substrate, the signal line driver circuit configured to be supplied with the parallel signal;
pixels over the substrate, the pixels electrically connected to the signal line driver circuit; and
a scanning line driver circuit over the substrate, the scanning line driver circuit electrically connected to the pixels,
wherein the pixels are arranged in a matrix to form a pixel region.

8. The display device according to claim 7,
wherein RC of a load between the external connection terminal and the serial-parallel conversion circuit satisfies a formula (1):

$$RC < \frac{1}{3 \cdot H \cdot V \cdot fps \cdot \ln(2n)} \quad (1)$$

wherein H represents a number of pixels provided for one scanning line, V represents a number of scanning lines, fps represents a frame rate, and n represents a number of grayscale levels.

9. A semiconductor device comprising:
a input portion;
a first signal line;
a second signal line;
an output portion; and
a unit comprising:
a first transistor;
a second transistor;
a third transistor;
a capacitor; and
an amplifier;
wherein a gate of the first transistor is electrically connected to the first signal line,
wherein a gate of the second transistor is electrically connected to the second signal line,
wherein one of a source of the first transistor and a drain of the first transistor is electrically connected to a first potential line,
wherein one of a source of the second transistor and a drain of the second transistor is electrically connected to the other of the source of the first transistor and the drain of the first transistor,
wherein the other of the source of the second transistor and the drain of the second transistor is electrically connected to a second potential line,
wherein a gate of the third transistor is electrically connected to the other of the source of the first transistor and the drain of the first transistor,
wherein one of a source of the third transistor and a drain of the third transistor is electrically connected to the input portion,
wherein a first electrode of the capacitor is electrically connected to the other of the source of the third transistor and the drain of the third transistor,
wherein a second electrode of the capacitor is electrically connected to a third potential line,
wherein an input terminal of the amplifier is electrically connected to the other of the source of the third transistor and the drain of the third transistor, and
wherein an output terminal of the amplifier is electrically connected to the output portion.

10. The semiconductor device according to claim 9, wherein the first transistor, the second transistor, and the third transistor each comprise an n-type crystalline silicon film.

11. The semiconductor device according to claim 9,
wherein the input portion is configured so that a serial signal is input to, and
wherein the output portion is configured to output a parallel signal converted from the serial signal.

12. The semiconductor device according to claim 9,
wherein a first control signal is input to the gate of the first transistor from the first signal line, and
wherein a second control signal which is an inversion signal of the first control signal is input to the gate of the second transistor from the second signal line.

13. The semiconductor device according to claim 9,
wherein the second potential line is supplied with a ground potential, and
wherein the third potential line is supplied with a ground potential.

14. A serial-parallel conversion circuit comprising the semiconductor device according to claim 9.

15. A display device comprising:
a substrate;
the serial-parallel conversion circuit according to claim 14 over the substrate, the serial-parallel conversion circuit configured so that a serial signal is input to and configured to output a parallel signal;
an external connection terminal over the substrate, the external connection terminal configured so that the serial signal is input to;
a control circuit over the substrate, the control circuit configured to output a selection signal;
a signal line driver circuit over the substrate, the signal line driver circuit configured to be supplied with the parallel signal;
pixels over the substrate, the pixels electrically connected to the signal line driver circuit; and
a scanning line driver circuit over the substrate, the scanning line driver circuit electrically connected to the pixels,
wherein the pixels are arranged in a matrix to form a pixel region.

16. The display device according to claim 15,
wherein RC of a load between the external connection terminal and the serial-parallel conversion circuit satisfies a formula (1):

$$RC < \frac{1}{3 \cdot H \cdot V \cdot fps \cdot \ln(2n)} \quad (1)$$

wherein H represents a number of pixels provided for one scanning line, V represents a number of scanning lines, fps represents a frame rate, and n represents a number of grayscale levels.

17. A method for driving a serial-parallel conversion circuit, the serial-parallel conversion circuit comprising:
a input portion;
a first signal line;
a second signal line; and
m units (m is a natural number greater than or equal to 1) each comprising:
a first transistor;
a second transistor;
a third transistor; and
a capacitor;
wherein a gate of the first transistor is electrically connected to the first signal line,
wherein a gate of the second transistor is electrically connected to the second signal line,
wherein one of a source of the first transistor and a drain of the first transistor is electrically connected to one of a source of the second transistor and a drain of the second transistor,
wherein a gate of the third transistor is electrically connected to the one of the source of the first transistor and the drain of the first transistor,
wherein one of a source of the third transistor and a drain of the third transistor is electrically connected to the input portion,
wherein a first electrode of the capacitor is electrically connected to the other of the source of the third transistor and the drain of the third transistor,
the method comprising the steps of:
inputting a first control signal at a high level to the gate of the first transistor of a kth unit from the first signal line and a second control signal at a low level to the gate of the second transistor of the kth unit from the second signal line, so that a potential of the first electrode of the capacitor corresponds to a potential of a serial signal which is input to the input portion (k is a natural number greater than or equal to 1 and less than or equal to m); and
after inputting the first control signal at a high level to the gate of the first transistor of the kth unit from the first signal line and the second control signal at a low level to the gate of the second transistor of the kth unit from the second signal line, inputting the first control signal at a low level to the gate of the first transistor of the kth unit and the second control signal at a high level to the gate of the second transistor of the kth unit to maintain the potential of the first electrode of the capacitor,
wherein the steps are performed on each of m units sequentially.

18. The method for driving a serial-parallel conversion circuit according to claim 17, wherein the first transistor, the second transistor, and the third transistor each comprise an n-type crystalline silicon film.

* * * * *